United States Patent
Merrick et al.

(10) Patent No.: US 6,446,229 B1
(45) Date of Patent: Sep. 3, 2002

(54) METHOD AND APPARATUS FOR INTEGRATED FLIP-FLOP TO SUPPORT TWO TEST MODES

(75) Inventors: Dale F. Merrick, Beaverton, OR (US); Joachim Priesnitz, Erfurt (DE)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/607,184

(22) Filed: Jun. 29, 2000

(51) Int. Cl.[7] .............................................. H04B 17/00
(52) U.S. Cl. ..................................................... 714/724
(58) Field of Search ................................. 714/724, 726; 327/202

(56) References Cited

U.S. PATENT DOCUMENTS 5,459,735 A * 10/1995 Narimatsu
5,488,614 A * 1/1996 Shima ........................ 714/726
5,689,517 A * 11/1997 Ruparel ..................... 714/726
6,181,179 B1 * 1/2001 Kanba ........................ 327/202

* cited by examiner

Primary Examiner—Phung M. Chung
(74) Attorney, Agent, or Firm—Michael J. Nesheiwat

(57) ABSTRACT

A circuit, an integrated flip flop, to receive an input in response to a clock signal. The integrated flip flop has a first and second slave latch and a master latch. The first slave latch receives an output from the master latch in response to the clock signal and a control signal for a first test mode of operation. The second slave latch receives an output from the master latch in response to the clock signal in one of a second test mode of operation or a normal functional mode of operation.

16 Claims, 4 Drawing Sheets

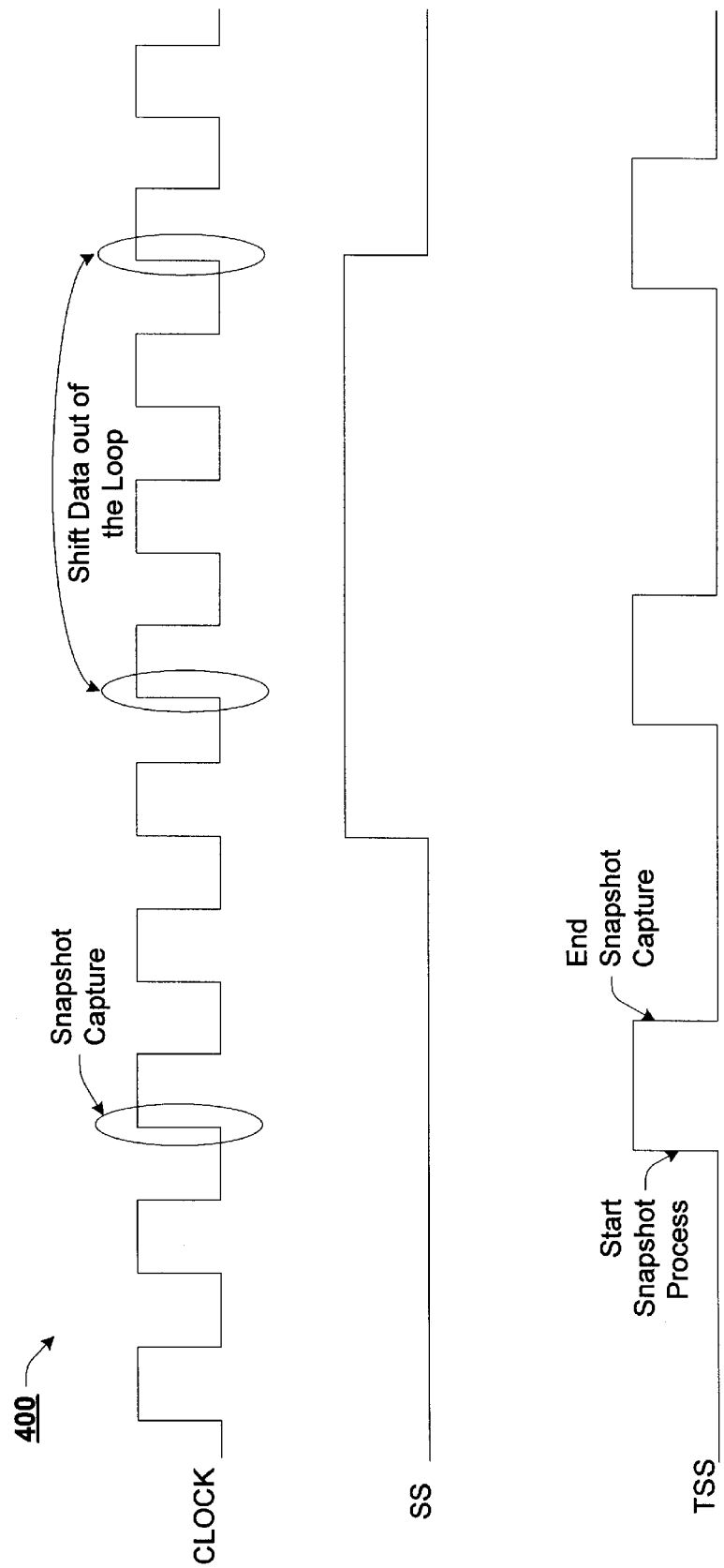

METHOD AND APPARATUS FOR INTEGRATED FLIP-FLOP TO SUPPORT TWO TEST MODES

BACKGROUND OF THE INVENTION

1. Field of the Invention

The present invention relates to failure detection, and specifically to a method and apparatus for failure detection within an integrated circuit device utilizing an integrated flip-flop capable of supporting two test modes of operation.

2. Description of the Related Art

As the technology for manufacturing integrated circuits advances, more logic functions are included in a single integrated circuit device. Modem integrated circuit (IC) devices include large numbers of gates on a single semiconductor chip, with these gates interconnected so as to perform multiple and complex functions. The fabrication of an IC incorporating such Very Large Scale Integration (VLSI) must be error free, as a manufacturing defect may prevent the IC from performing all of the functions that an IC is designed to perform. Such demands require verification of the design of the IC and also various types of electrical testing after the IC is manufactured.

However, as the complexity of the IC increases, so does the cost and complexity of verifying and electrically testing each of the devices in the IC. Electrical testing ensures that each node in a VLSI circuit functions properly. Therefore, each node needs to individually, and in conjunction with the other node in the IC, function properly in all possible combinations of operations. Typically, electrical testing is performed by automated testing equipment (ATE) that employs test vectors to perform the desired tests. A test vector describes the desired test input (or signals), associated clock pulse (or pulses), and expected test output (or signals) for every package pin during a period of time, often in an attempt to "test" a particular node. For complex circuitry, this may involve a large number of test vectors and accordingly, a long test time.

One way to address this problem is through design for test (DFT). The key concepts in DFT are controllability and observability. Controllability is the ability to set and reset the state of every node in the IC. Observability is the ability to observe either directly or indirectly the state of any node in the IC. The purpose of DFT is to increase the ability to control and observe internal and external nodes from external inputs/outputs.

DFT methods utilize various test circuits. One type of test circuit is a scan path or a scan loop in the logic circuit. A scan path or scan loop comprises of a chain of synchronously clocked master/slave latches (or registers), each of which is connected to a particular node in the logic circuit. Typical scan circuit designs involve two or more separate scan paths or scan loops. For example, FIG. 1 illustrates a prior art circuit with flip-flops in two separate scan paths, one scan path for snapshot mode of operation and one scan path for scan mode of operation. A first scan path is formed by shadow flip-flops 102 and 104 and an output is labeled snapshot_do 110. A second scan path is formed by flip-flops 106 and 108 and an output is labeled scando 120. This circuit design with multiple flip-flops for separate scan paths increases design complexity because of the increased routing and power consumption requirements.

The scan latches can be loaded with a serial data stream of scan vectors that set the logic circuit nodes to a predetermined state. The logic circuit then can be operated in normal fashion and the result of the operation is stored in its respective latch. A scan out operation serially unloads the contents of the latches and the result of the test operation at the associated nodes is analyzed for improper node operation.

Another DFT feature is a snapshot. A snapshot allows latching a state of the IC during normal operation, rather than scan vectors that initialize the integrated device to a particular state. The snapshot feature is helpful in debug analysis of computer system to insure integrity of the system hardware and software. The snapshot feature allows observability of internal nodes within the system to verify functionality.

The snapshot feature is triggered in a variety of methods. For example, a particular data signature generated by internal logic or an external event such as an external pin of the IC triggers a snapshot operation. The contents of the snapshot latches are unloaded via a test port. One example of a test port is a defined by the Institute of Electrical and Electronic Engineers(IEEE) is a Joint Test Action Group (JTAG) test protocols set forth in IEEE standard 1149.1. In such a system, a JTAG test device is connected to a pair of ICs or to a single IC. The JTAG device generates test commands for testing the ICs. Input and output of JTAG test commands is achieved through a set of JTAG-dedicated pins provided on each IC to be tested. Typically, the JTAG test device is employed to perform a boundary-scan test. The JTAG test commands for the boundary-scan test are adapted for testing the interconnections of ICs and are not typically well suited for testing or monitoring the internal logic of a IC. General information regarding JTAG and boundary-scan test strategies and implementations may be found in "Boundary-Scan Test, A Practical Approach", by Harry Bleeker, Peter Van Den Eijnden and Frans de Jong, Kluwer Academic publishers 1993.

BRIEF DESCRIPTION OF THE SEVERAL VIEWS OF THE DRAWINGS

The present invention is illustrated by way of example and not limitation in the following figures. Like references indicate similar elements, in which:

FIG. 4 illustrates a timing waveform diagram in accordance with an embodiment of the present invention.

DETAILED DESCRIPTION OF THE INVENTION

A method and apparatus for failure detection within an integrated circuit device utilizing an integrated flip-flop capable of supporting two test modes of operation is described. In the following description, for purposes of explanation, numerous details are set forth in order to provide a thorough understanding of the present invention. However, it will be apparent to one skilled in the art that these specific details are not required in order to practice the present invention.

Figure 1:
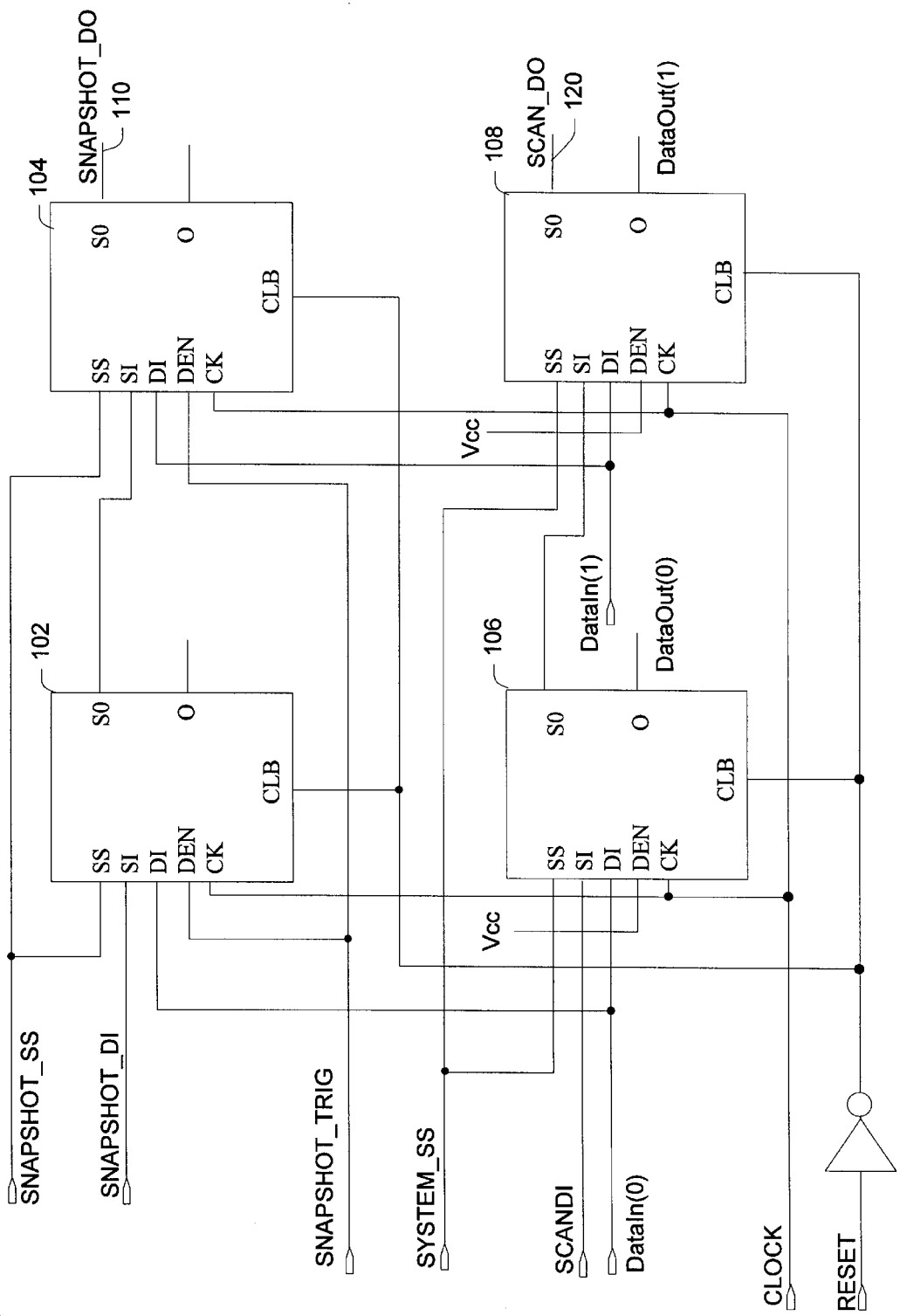
FIG. 1 illustrates a prior art logic circuit diagram.
Figure 2:
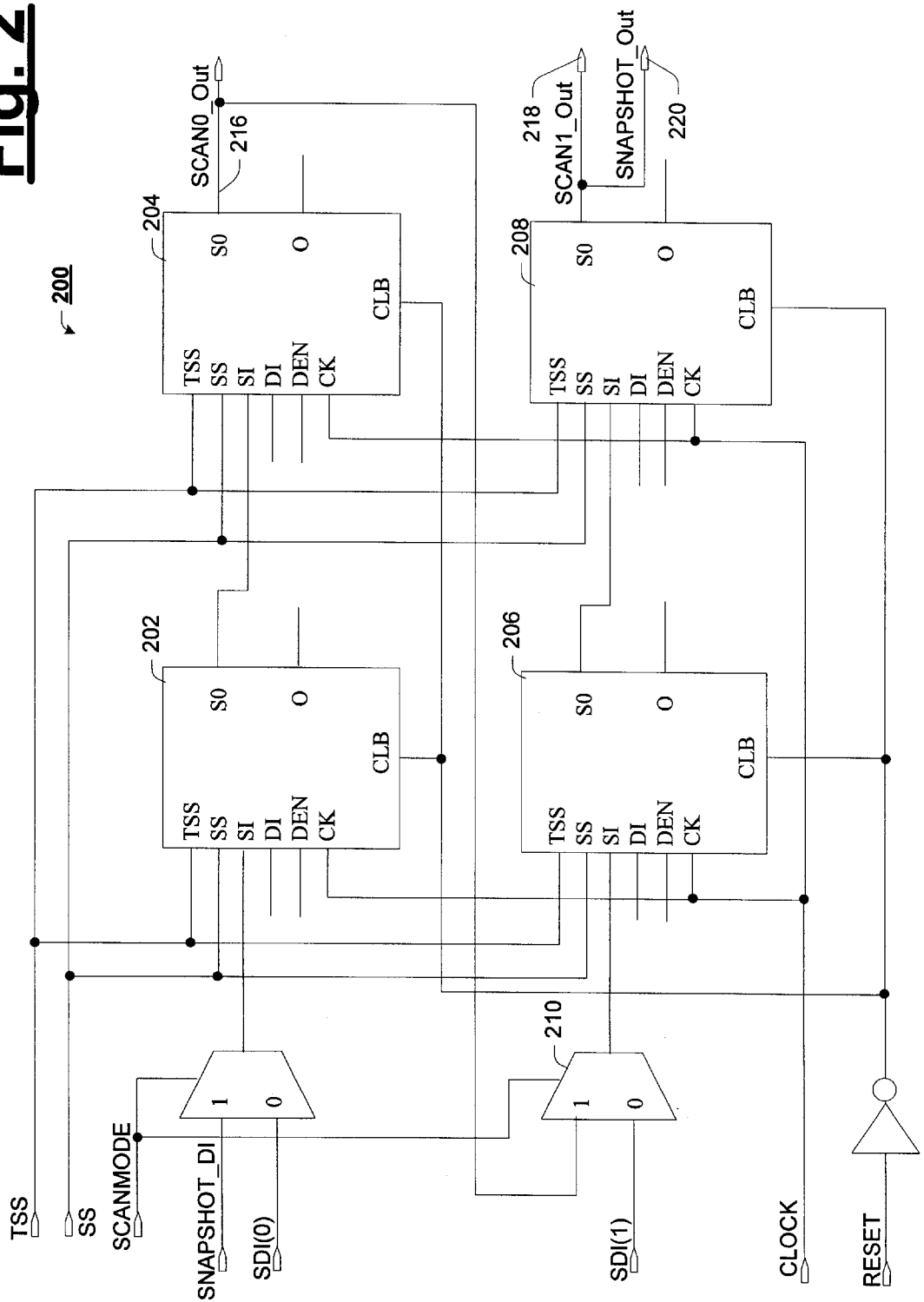
FIG. 2 illustrates a block diagram of a circuit utilized by an embodiment of the present invention.

FIG. 2 illustrates a block diagram of logic 200 utilized by an embodiment of the present invention. The logic 200 comprises integrated flip-flops 202, 204, 206, and 208. The integrated flip-flops receive an input from the internal logic of the IC or from an external pin. The integrated flip-flops store the logic states of various internal nodes of the IC in response to test vectors. The logic states of the flip-flops are compared to results generated from logic simulation.

The integrated flip-flops in logic 200 form multiple scan paths. For example, a first scan path is formed by flip-flops 202 and 204. An output 216 of the scan path is labeled scan0_out. A second scan path is formed by flip-flops 206 and 208. The output 218 of this scan path is labeled scan1_out. A control signal, scanmode, enables the snapshot operation and combines the two scan paths into one scan path by coupling the output of scan0_out from the first scan path to an input of a multiplexer 210 in the second scan path. Therefore, the scan paths are combined into one long scan path with an output 220 of snapshot out.

Figure 3:
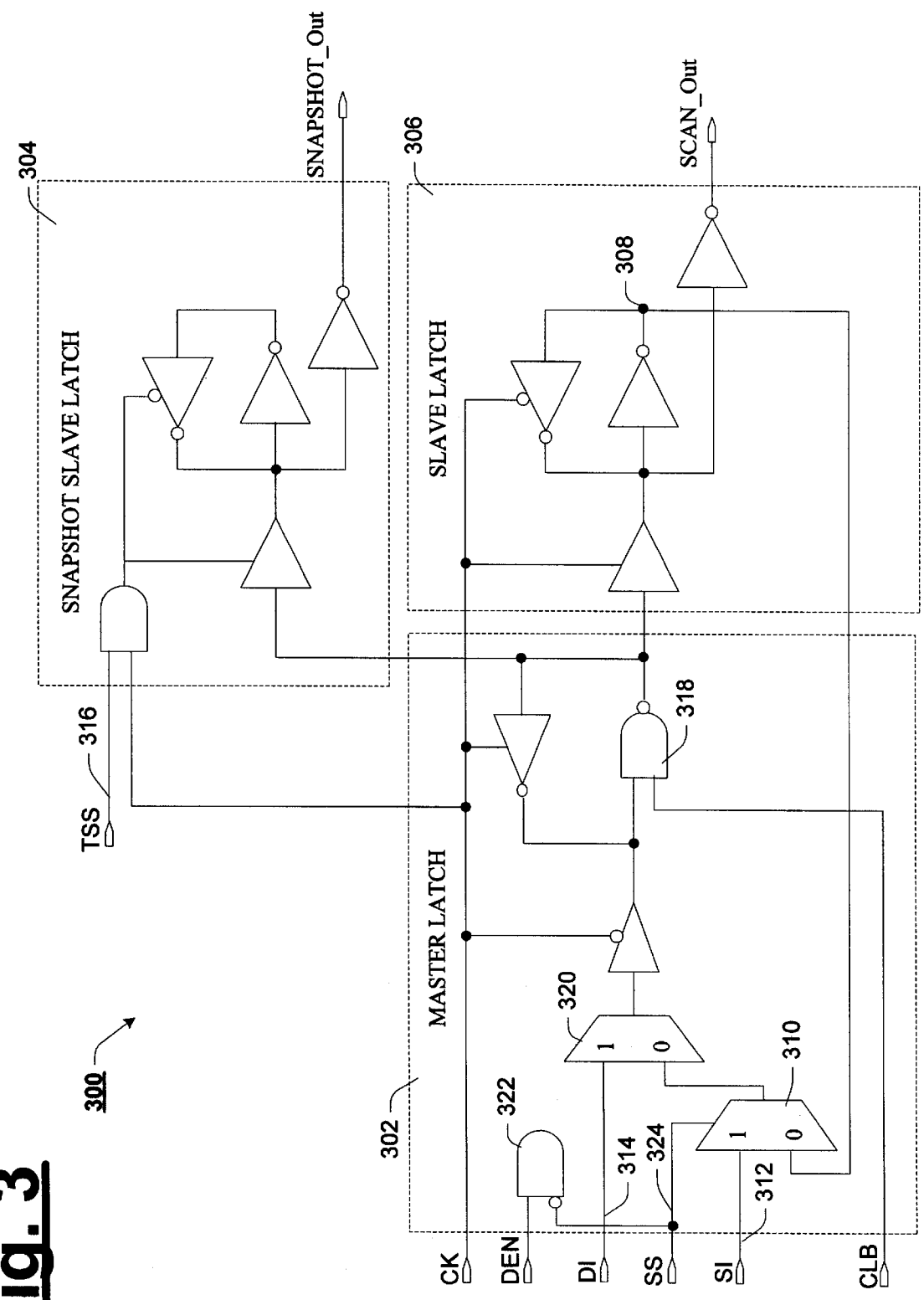
FIG. 3 illustrates a diagram of a circuit utilized by an embodiment of the present invention.

FIG. 3 illustrates a circuit diagram of an integrated flip-flop 300 utilized by an embodiment of the present invention. The integrated flip-flop supports two test modes of operation, snapshot and scan. The integrated flip-flop 300 comprises a master latch 302 and a plurality of slave latches 304 and 306. The slave latch 304 is hereafter referred to as the snapshot slave latch.

The master latch receives data on the rising edge of the clock signal, ck. The slave latch 306 and the snapshot slave latch 304 receive data on the falling edge of the ck signal. The master latch 302 has two external input signals, si 312 and di 314, and one internal input which is a feedback from a node 308 in slave latch 306 to a multiplexer 310 in master latch 302. The input signal, si, in the scan test mode of operation, allows data to be serially scanned into the master latch 302 and initializes the IC to a known state. The di signal allows the master latch 302 to receive data from the internal logic of the IC during the normal operation of the IC. The control signal ss selects either the di or si input signal. For example, if the ss signal is a logic 1, the master latch 302 receives an input via the si signal. Otherwise, the den signal selects either the di signal or the internal input 308. If the den signal is a logic 1, the master latch 302 receives data from the di signal. Otherwise, the master latch 302 receives the data via node 308. The node 308 represents the current state of the integrated flip-flop. Therefore, if the master latch 302 receives data via node 308, the master latch 302 is retaining the current state of the master and slave flip-flop. The signal clb is a reset pin for the integrated flip-flop and initializes the flip-flop to a "0"b value.

Both the snapshot slave latch 304 and the slave latch 306 receive an output from the master latch 302. The snapshot slave latch 304 receives an output from the master latch 302 for a test mode of operation, snapshot. The snapshot slave latch 304 receives the output from the master latch 302 if a tss signal 316 is a logic high and if the clock signal, ck, is logic high. The slave latch 306 receives the output from master latch 302, the output of AND gate 318, in response to a test mode of operation, scan, or during normal operation of the IC via gate 318. A multiplexer 320 selects whether the slave latch 306 receives data from di 314 during normal operation of the IC or from si 312 during the scan test mode of operation. The multiplexer 320 selects di 314 or si 312 in response a control signal from an AND gate 322. For example, if ss signal 324 is a logic 1, the multiplexer 320 selects the si signal 312. Otherwise, the multiplexer 320 selects di signal 314.

The integrated flip flop 300 supports both the scan and snapshot test mode of operation in a single scan path design thereby reducing silicon area and power consumption. In contrast, prior art flip-flop designs utilize two flip flops and two separate scan paths to support both test modes of operation.

One skilled in the art appreciates utilizing various embodiments. For example, the snapshot slave latch 304 and the slave latch 306 could have different transistor sizes and drive strengths to accommodate various design and power requirements.

FIG. 4 illustrates a timing waveform diagram 400 utilized by an embodiment of the present invention. The timing waveform diagram 400 represents a timing method for the signals clock, ss, and tss for the snapshot test mode of operation discussed with reference to FIG. 3.

The snapshot test mode of operation is a real time event. The tss signal is the enable signal for initiating the snapshot test mode of operation. The snapshot begins with setting the tss signal active on a falling edge of the clock signal. Next, the snapshot capture occurs at the next rising edge of the clock signal. Finally, to insure only one snapshot has occurred, the tss signal is set low on the next falling edge of the clock signal.

After the snapshot capture is complete, the contents of the snapshot slave latches are shifted out of the IC to a computer system via the JTAG test port. The computer system comprises, in one embodiment of the invention, simulation software for analyzing the latched values for failure detection. The shift out operation of the snapshot slave latches begins with the ss signal held active. Next, the tss signal is pulsed once for every snapshot slave latch in the scan path. For example, if there are 1000 snapshot slave latches in the scan path, the tss signal is pulsed 1000 times for the entire shift out operation. The ss signal is held active for the entire shift out operation.

One skilled in the art would appreciate utilizing various embodiments. For example, a subset of the snapshot slave latches could be stored on a computer system or a memory for future analysis rather than analyzing the complete set of snapshot latches. Also, test software could recursively repeat the snapshot test feature for a new set of trigger conditions until the data in the shift out operations matches a signature. The signature could be created via a logic simulation of certain error conditions.

While the invention has been described with reference to specific modes and embodiments, for ease of explanation and understanding, those skilled in the art will appreciate that the invention is not necessarily limited to the particular features shown herein, and that the invention may be practiced in a variety of ways that fall under the scope and spirit of this disclosure. The invention is, therefore, to be afforded the fullest allowable scope of the claims that follow.

What is claimed is:

1. A circuit comprising:
    a flip flop to receive an input in response to a clock signal, the flip flop comprising:
        a master latch to receive the input in response to the clock signal;
        a first slave latch to receive an output from the master latch in response to the clock signal and a control signal for a first test mode of operation; and
        a second slave latch to receive an output from the master latch in response to the clock signal in one of a second test mode of operation or a normal functional mode of operation.

2. The circuit of claim 1 wherein the first test mode of operation is a snapshot operation in response to one of a system error condition or a data signature.

3. The circuit of claim 1 wherein the second test mode of operation is a scan operation in response to a scan control signal.

4. The circuit of claim 1 wherein the control signal is set active on the falling edge of the clock signal one clock cycle before the start of the first test mode of operation.

5. The memory of claim 1 wherein the first slave latch comprises an output which is coupled to an external pin.

6. A method comprising:

receiving an input at a first latch in response to a clock signal;

transmitting an output from the first latch to an input of a second latch in response to the clock signal and a control signal for a first test mode of operation; and transmitting an output from the first latch to an input of a third latch in response to the clock signal for a second test mode of operation.

7. The method of claim 6 wherein the first latch is a master latch to receive the input from one of a logic or an external pin.

8. The method of claim 6 wherein the first test mode of operation is a snapshot in response to one of a system error condition or a data signature.

9. The method of claim 6 wherein the second test mode of operation is a scan in response to a scan control signal.

10. The method of claim 6 wherein the control signal is set active on a falling edge of the clock signal one clock cycle before the first test mode of operation.

11. The method of claim 6 wherein the first latch comprises an output coupled to on an external pin.

12. A circuit comprising:

a master latch to receive an input in response to a clock signal;

a first slave latch to receive an output from the master latch in response to the clock signal and a control signal for a first test mode of operation; and a second slave latch to receive an output from the master latch in response to the clock signal in either one of a second test mode of operation or a normal functional mode of operation.

13. The circuit of claim 12 wherein the first test mode of operation is a snapshot operation in response to one of a system error condition or a data signature.

14. The circuit of claim 12 wherein the second test mode of operation is a scan operation in response to a scan control signal.

15. The circuit of claim 12 wherein the control signal is set active on a falling edge of the clock signal one clock cycle before the first test mode of operation.

16. The memory of claim 12 wherein the first slave latch comprises an output coupled to an external pin.

* * * * *

UNITED STATES PATENT AND TRADEMARK OFFICE
CERTIFICATE OF CORRECTION

PATENT NO.    : 6,446,229 B1
DATED         : September 3, 2002
INVENTOR(S)   : Merrick et al.

It is certified that error appears in the above-identified patent and that said Letters Patent is hereby corrected as shown below:

Column 1,
Line 15, delete "Modem", insert -- Modern --.

Signed and Sealed this

Fourth Day of February, 2003

JAMES E. ROGAN
*Director of the United States Patent and Trademark Office*